United States Patent [19]

Heagerty et al.

[11] 4,418,402
[45] Nov. 29, 1983

[54] RADIATION HARDENED ACCESSIBLE MEMORY

[75] Inventors: William F. Heagerty, Norristown, Pa.; Gerald T. Caracciolo, Trenton; William F. Gehweiler, Moorestown, both of N.J.

[73] Assignee: RCA Corporation, New York, N.Y.

[21] Appl. No.: 263,124

[22] Filed: May 13, 1981

[51] Int. Cl.³ ............................................ G11C 11/40
[52] U.S. Cl. .................................... 365/156; 307/279
[58] Field of Search ....................... 365/154, 156, 190; 307/279

[56] References Cited

U.S. PATENT DOCUMENTS

| | | | |
|---|---|---|---|
| 3,644,907 | 2/1972 | Gricchi et al. | 365/156 |
| 3,964,031 | 6/1976 | Eaton | 365/156 |
| 4,130,892 | 12/1978 | Gunckel et al. | 365/156 |
| 4,253,162 | 2/1981 | Hollingsworth | 365/156 |

OTHER PUBLICATIONS

Yasui et al., "High Speed Low-Power CMOS Static RAMs", *Electronic Engineering*, vol. 53, No. 650, 3/81, pp. 51-55.

*Primary Examiner*—Stuart N. Hecker
*Attorney, Agent, or Firm*—J. S. Tripoli; D. W. Phillion

[57] ABSTRACT

A bistable solid-state device, substantially immune to long term, low level radiation comprises, in combination with memory storage elements, means comprising P-type devices responsive to enabling and disabling signals for conducting signals to and from the memory storage elements only during the presence of read and write signals, and which are substantially immune to the effects of long term, low level radiation, thereby substantially increasing the reliability of solid-state memory cells. Also provided are means for generating a control signal having first and second levels and logic means responsive to said control signals of a first level to generate and supply said enabling signal to said P-type device and further responsive to said control signal of a second level to generate and supply said disabling signal to said P-type device. Sensing means for sensing the state of said bistable memory elements during a time period between successive level changes of said control signals is also provided.

4 Claims, 4 Drawing Figures

RADIATION HARDENED ACCESSIBLE MEMORY

The United States Government has rights in this invention pursuant to Contract No. MDA 904-79-G-0032 awarded by the Department of the Army.

This invention relates generally to solid-state bistable devices which can be employed as memory cells and more particularly to such solid-state devices which are highly resistant to the effects of long term, low level radiation, such as caused by gamma and cosmic rays.

Certain types of memory cells currently in use employ two state logic comprising solid-state devices each having a source electrode, a drain electrode, and a gate electrode and constructed to act as switches in that the source electrode to drain electrode internal impedance can be either very high or very low by applying the proper potentials across the gate electrode and source electrodes. There are two types of such solid-state devices, one known in the art as a P-type device and the other as an N-type device. In the P-type device the source to drain impedance becomes very low, i.e., highly conductive, when the gate-to-source electrode potential becomes more negative than the P-device threshold voltage, and becomes non-conductive when the gate-to-source electrode potential becomes less negative than the P-device threshold voltage.

On the other hand, the N-type device becomes highly conductive when the gate-to-source electrode potential becomes more positive than the N-device threshold voltage and becomes non-conductive when the gate-to-source electrode potential become less positive than the N-device threshold voltage. Thus, the P-type device will become conductive when the potential of the gate electrode thereof is approximately more than one volt negative with respect to the source electrode and the N-type device becomes conductive when the potential of the gate electrode is more than one volt positive with respect to the source electrode.

With most prior art memory cells employing solid-state devices two input terminals are provided for the writing in of binary 1's or 0's. More specifically, to write a binary 1 into the memory a high level signal is applied to a first of the two input terminals and a low level signal is supplied to the other input through appropriate switching means. To write a binary 0 into the memory system a low level signal is supplied to the first input terminal of the memory and a high level signal to the second input terminal. Appropriate switching or accessing means are provided to supply such high and low level signals to the input terminals of the memory device in accordance with whether a binary 1 or a binary 0 is to be written therein. To read the contents of the memory the said switching means connected to a selected one of the input terminals is enabled, that is, made conductive so that the contents of the memory device can be supplied to an appropriate detection and utilization means.

The aforementioned prior art memory devices are very sensitive to external signals supplied to the two input terminals. Accordingly, the switching means for supplying the input signals to the memory device must have the characteristic of being conductive, i.e., having a low impedance, only during the time interval that write and read signals are being supplied to the memory system and at all other times present a high impedance to the logic external of the memory device.

The switching devices employed in prior art devices have been N-type switches or devices. It has been found that exposure to long term, low level radiation, such a gamma or cosmic rays, will change the operating characteristics of N-type devices in such a manner that they develop significant leakage currents at times when they should be high impedance devices with insignificant leakage current.

In accordance with one embodiment of the present invention there is provided in combination with solid-state memory storage elements means, switching means comprising P-type devices responsive to enabling and disabling signals, for conducting signals into said memory storage elements only during the presence of read and write signals, and which are substantially immune to the effects of long term, low level radiation, thereby substantially increasing the reliability of said solid-state memory elements. Also provided are means for generating a control signal having first and second levels and logic means responsive to said control signal of a first level to generate and supply an enabling signal to the P-type device, and further responsive to said control signal of a second level to generate and supply a disabling signal to the P-type device. Means for sensing the state of said bistable memory elements during a time period between successive level changes of the control signal is also provided.

Figure 2:
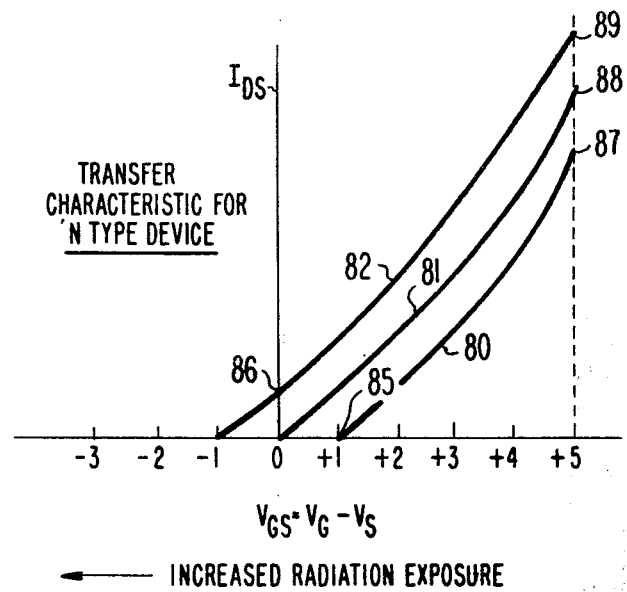
FIG. 2 is a set of transfer characteristics illustrating the operation of an N-type device.
Figure 3:
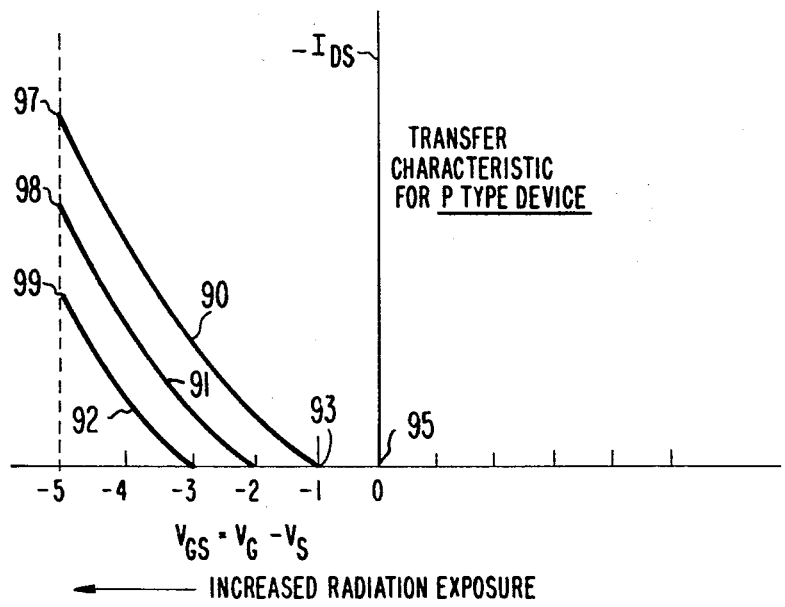
FIG. 3 is a set of transfer characteristics illustrating the operation of a P-type device.

In order to understand the invention it is necessary to understand the characteristics of both N and P-type devices. Accordingly, the transfer characteristics of P and N-type device, as shown in FIGS. 2 and 3, will be first generally discussed in connection with the P1 and N1 devices of FIG. 1. Such transfer characteristics apply to all the P and N-type devices shown in FIG. 1.

Figure 1:
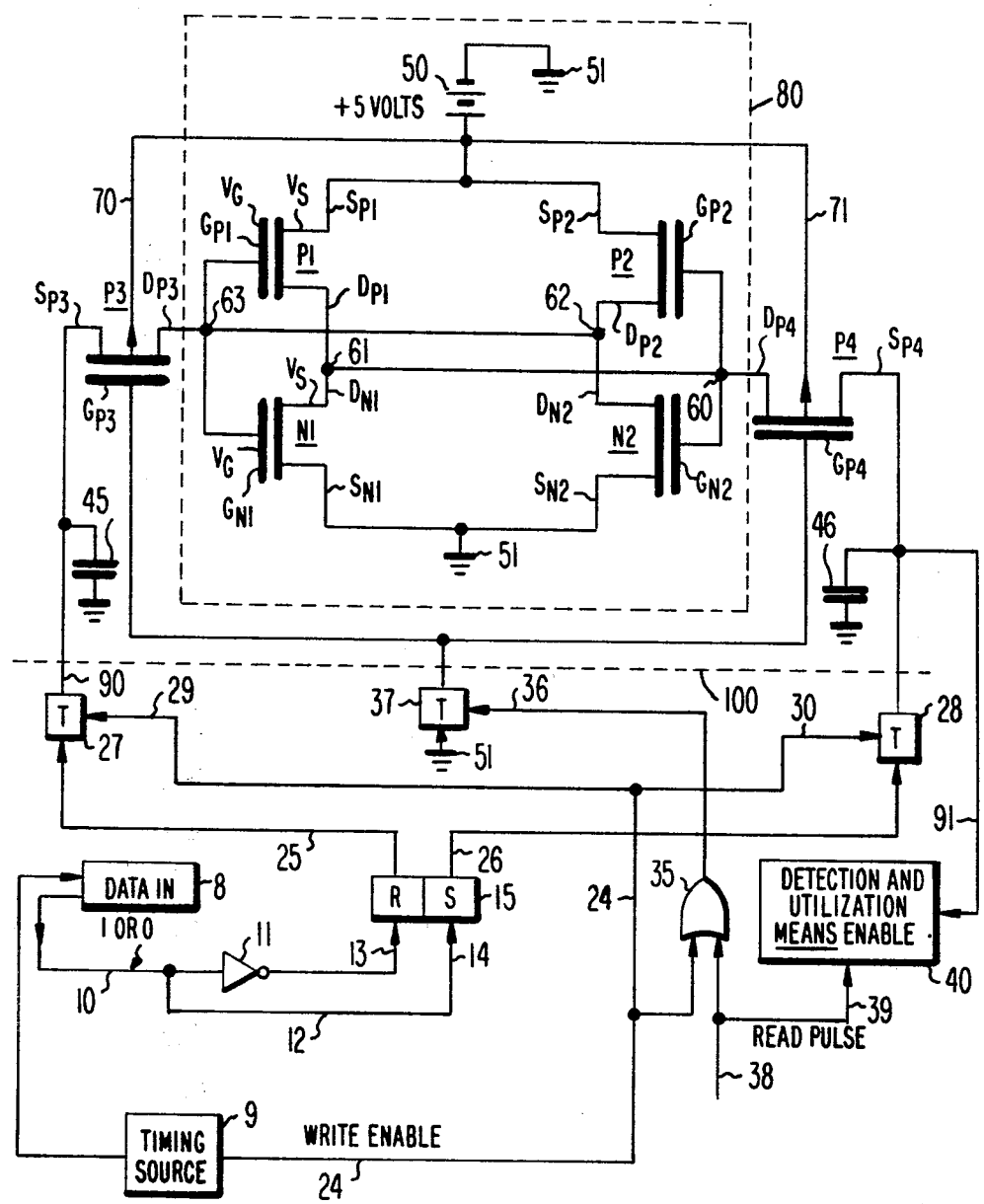
FIG. 1 is a combination schematic and logic diagram of the invention.

In FIG. 1 there are shown four P-type devices designated as P1, P2, P3 and P4 and two N-type devices N1 and N2. Each of the P and N devices has a source electrode, a drain electrode and a gate electrode. These three electrodes are designated by S for source, D for drain, and G for gate, with a subscript indicating which specific device is being identified. Thus, $S_{P1}$, $D_{P1}$ and $G_{P1}$ are, respectively, the source electrode, the drain electrode and the gate electrode associated with the P1 device. The N1 device comprises a source electrode $S_{N1}$, a drain electrode $D_{N1}$ and a gate electrode $G_{N1}$. Similar nomenclature is employed for the remaining devices P2, P3, P4, and N2. The devices are usually CMOS/SOS.

Referring now to FIG. 2 the characteristic curve 80 represents the operating characteristics of the N1 type device of FIG. 1. It is a characteristic of an N-type device that, in the absence of a long term, low level radiation effect, it will become conductive when the potential of the gate $G_{N1}$ becomes positive with respect to the potential of the source electrode $S_{N1}$. Specifically, such a device will become conductive at the point 85 when the potential of the electrode $G_{N1}$ becomes approximately 1 volt positive with respect to the potential of source electrode $S_{N1}$. Such a difference in potential is designated as $V_{GS}$ and is equal to $V_G - V_S$, where $V_G$ is the potential of gate electrode $G_{N1}$ and $V_S$ is the potential of source electrode $S_{N1}$.

As the potential of gate electrode $G_{N1}$ becomes increasingly more positive with respect to the potential of source electrode $S_{N1}$, the current $I_{DS}$ between source electrode $S_{N1}$ and drain electrode $D_{N1}$ becomes increasingly greater, as represented by the curve 80 of FIG. 2. At the same time, the impedance between source electrode $S_{N1}$ and drain electrode $D_{N1}$ decreases so that the potential of drain electrode $D_{N1}$ decreases towards that of source electrode $S_{N1}$, which is at ground potential as shown in FIG. 1.

Thus, the N-type device N1 acts in the nature of a switch. More specifically, when zero volts are supplied to gate electrode $G_{N1}$ the source $S_{N1}$ to drain $D_{N1}$ impedance of N1 is a very high and is effectively an open circuit. Thus the potential of drain electrode $D_{N1}$ can rise to 5 volts under certain conditions of storage which will be discussed later.

On the other hand, when a positive 5 volts is supplied to gate electrode $G_{N1}$ the source $S_{N1}$ to drain $D_{N1}$ impedance of device N1 becomes very low and approaches zero impedance thereby causing the potential of drain electrode $D_{N1}$ to be the same as that of source electrode $S_{N1}$, which is ground potential.

It is to be noted that when device N1 is acting as an open circuited switch, in accordance with the operating characteristic curve 80 of FIG. 2, there is no current between source electrode $S_{N1}$ and drain electrode $D_{N1}$. However, it is a characteristic of both N-type devices and P-type devices that when exposed to long term, low level radiation, such as cosmic rays, the required potential of the applied gate voltage with respect to the source voltage at which conduction begins becomes increasingly negative. Thus, in FIG. 2 after the N1 device has been exposed to low level radiation for some time the operating characteristic will change from that represented by curve 80 to that represented by curve 81 wherein conduction between the source and drain electrodes begins when the potential of gate electrode $G_{N1}$ is equal to the potential of source electrode $S_{N1}$.

After an even longer exposure to such low level radiation the transfer characteristic will shift even more to the left in FIG. 1 to a transfer characteristic represented by curve 82. An examination of the characteristic curve 82 shows that conduction will begin when the potential of gate electrode $G_{N1}$ is, in fact, negative with respect to the potential of the source electrode $S_{N1}$ by one volt. Thus, when it is desired that device N1 function as an open circuit, that is, when the potential $V_G$ of gate electrode $G_{N1}$ is at ground and the potential of drain electrode should be at 5 volts, there will, in fact, be an unwanted leakage current between the source and drain electrodes, as shown at point 86 of curve 82. Such leakage current, can, in fact, adversely affect the reliability of the information stored in the memory storage element which is defined as that structure within dotted block 98 of FIG. 1. The adverse effects caused by such source to drain leakage current will be discussed in more detail later herein.

Consider now the transfer characteristics of a P-type device, such as device P1 of FIG. 1. The characteristic behavior of a P-type device is that it will become conductive when the potential of the gate electrode $G_{P1}$ becomes negative with respect to the potential of the source electrode $S_{P1}$. It will be noted that this relationship of conductivity is different from that of an N-type device wherein conductivity occurs when the potential of the source electrode is negative with respect to the gate.

The characteristic curve 90 of FIG. 3 represents the operation of the device P1 in the absence of any effect due to long term, low level radiation. Conduction between source electrode $S_{P1}$ and drain electrode $D_{P1}$ of device P1 of FIG. 1 begins when the potential of the gate electrode $G_{P1}$ becomes a $-1$ volt with respect to the potential of source electrode $S_{P1}$. This onset of conduction is indicated at point 93 in FIG. 3.

As the potential of gate electrode $G_{P1}$ becomes increasingly negative with respect to that of source electrode $S_{P1}$ the current $I_{DS}$ between source electrode $S_{P1}$ and drain electrode $D_{P1}$ of P1 becomes increasingly greater, as indicated by transfer characteristic curve 90 of FIG. 3.

As in the case of the N1 device and P1 device acts as a switch but, contrary to the N1 device, becomes open circuited when the potential of the gate electrode $G_{P1}$ becomes less negative than $-1$ volt with respect to the potential of the source electrode $S_{P1}$ (i.e., to the right of point 93 in FIG. 3), and becomes increasingly conductive as the potential of the gate electrode becomes increasingly negative with respect to the potential of the source electrode $S_{P1}$ (to the left of point 93 in FIG. 3).

As in the case of N-type devices, the gate threshold voltage which is the point at which conduction begins in the P-type device, becomes increasingly negative with exposure to low level radiation. Thus, after a certain amount of exposure to low level radiation the operating characteristic of the P1 device will shift from the position of curve 90 of FIG. 3 to that of curve 91, wherein it can be seen that conduction between the source and the drain electrodes of P1 begins when the potential, of the gate electrode $G_{P1}$ is a $-2$ volts with respect to that of source electrode $S_{P1}$.

After even more exposure to low level radiation the operating characteristic curve can shift from that shown as curve 91 in FIG. 3 to that shown as curve 92 in FIG. 3. It can be seen that no matter how much exposure to low level radiation occurs the device will never have a source to drain current when the voltage of the gate electrode $G_{P1}$ is zero with respect to the potential of the source electrode $S_{P1}$, as indicated at point 95 in FIG. 3. Thus, there can never be leakage current through a P-type device when such device is supposed to perform the function of an open circuited switch.

The present invention employs this characteristic of a P-type device to improve the reliability of solid-state devices such as the solid-state bistable memory device shown in the dotted block 80 of FIG. 1.

Returning again to FIG. 1, devices P1 and N1 are connected in series in that the source electrode $S_{P1}$ of device P1 is connected to a positive 5 volt source 50 and the drain electrode $D_{P1}$ is connected to the drain electrode $D_{N1}$ of device N1, with the source of device N1 being connected to ground potential 51. Thus, the positive 5 volt source 50 is connected across the two source electrode-to-drain electrode paths of devices P1 and N1 in a series manner, and also across the two source-to-drain electrodes of devices P2 and N2 in series arrangement.

The storage system consisting of devices P1, P2, N1 and N2 is arranged so that during normal operation either one of P1 or N1 is conductive and the other is non-conductive and, at the same time, either one of P1 or N1 is conductive and the other is non-conductive. Thus, at any given time (i.e., in either of the two possible states) if P1 is conductive P2 cannot be conductive, and if N1 is conductive N2 cannot be conductive. In other words, in any given state the two devices P1 and N2 are both non-conductive or both conductive and the other two devices P2 and N1 are in the opposite state.

To enter a binary 1 into the storage element 80 a high level signal is supplied to input junction 60, also referred to as an input terminal, through device P4 to raise the potential of gates electrodes $G_{P2}$ and $G_{N2}$ to a high level volt value, thus causing device N2 to become conductive across its source to drain electrodes and to cause device P2 to become non-conductive across its source to drain electrodes. At the same time the positive 5 volts appearing on input terminal 60 is also applied to junction 61 between the drain electrode $D_{P1}$ and drain electrode $D_{N1}$ of devices P1 and N1.

Further, to enter a binary 1 into the storage system 80 a low voltage signal is supplied to input junction 63 at the same time that the high level signal is supplied to input junction 60. The low level signal supplied to junction 63 functions to cause device N1 to become non-conductive and the device P1 to become conductive, thus, creating a high impedance across N1 so that junction 61 can remain at its high level 5 volt value.

When a binary 0 is entered into the storage element 80 a high level 5 volt signal is supplied to input junction 63 and, simultaneously, a low level signal is supplied to input junction 60. Such input signal will cause device P1 to become non-conductive and device N1 to become conductive and will also cause device P2 to become conductive and device N2 to become non-conductive. More specifically, the 5 volt signal at input junction 63 will raise the potential of the gate electrode $G_{P1}$ to that of potential of source electrode $S_{P1}$ which, in accordance with curve 90 of FIG. 3, will cause device P1 to become non-conductive. At the same time the high level voltage supplied to gate electrode $G_{N1}$ of device N1 will cause device N1 to become conductive in accordance with the curve 80 of FIG. 2. On the other hand, the low level signal supplied to the input junction 60 will cause P2 to become conductive in accordance with curve 90 of FIG. 3 and will cause device N2 to become non-conductive with in accordance with waveform 80 of FIG. 2.

Thus, binary 1 can be entered into the memory 80 by supplying a high level signal and a low level signal simultaneously and respectively to input junctions 60 and 63, or a binary 0 can be entered into the system by simultaneously supplying a low level signal and a high level signal to said input junctions 60 and 63, respectively.

It is desirable that the storage means 80 be substantially isolated from externally generated signals during those time periods when the writing of a binary 0 or binary 1 therein or the reading of the stored contents of said storage means 80 is not being effected. Such isolation is obtained with the use of devices P3 and P4 which act as open switches during those time periods when a write-in or a read-out function is not occurring. For reasons discussed above in relation to the general description of the operation of P-type devices, the two devices P3 and P4 will not develop leakage currents from long term exposure to low level radiation, such as cosmic rays. Thus the storage means 80 will remain isolated from external signals during those times when read or write functions are not occurring.

Figure 4:
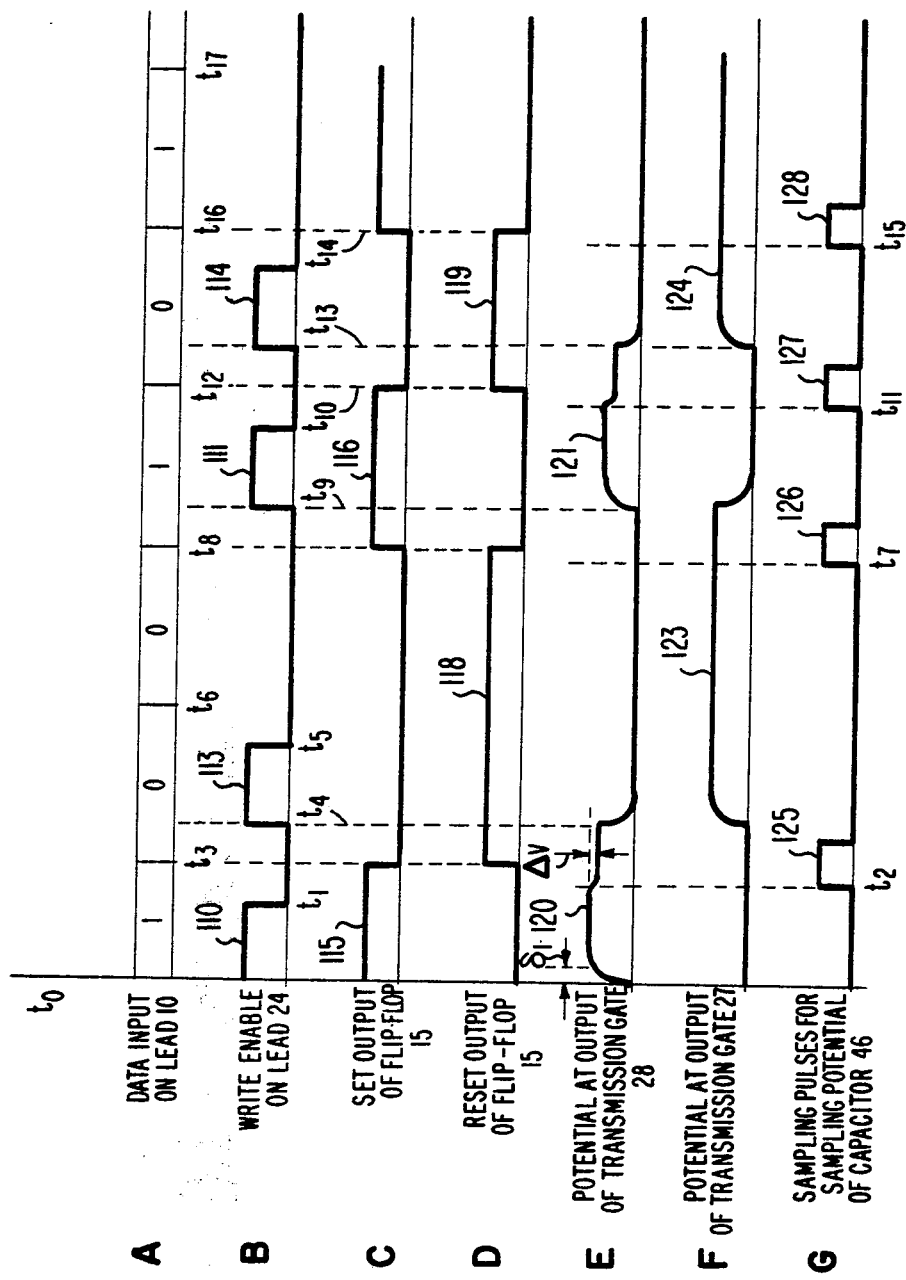
FIG. 4, consisting of A–G, is a set of waveforms showing the potential at various points in the circuit of FIG. 1 during the operation thereof.

Logic means suitable for enabling the P3 and P4 devices to become conductive during read or write functions and to cause them to be non-conductive during other times are shown below the dotted line 100 in FIG. 1. Binary signals in the form of low level spaces and high level mark signals are supplied to input lead 10 of FIG. 1. Such space and mark signals are shown in waveform A of FIG. 4. The leading edges of the space signals (binary 0's) are inverted by inverter 11 (FIG. 1) to reset flip-flop 15 and the leading edges of mark signals (binary 1's) function to set flip-flop 15. For purposes of convenience the waveforms of FIG. 4 will hereinafter be referred to as waveform 4A, 4B, etc. rather than as waveform A of FIG. 4.

The reset and set output of flip-flop 15 (referred to herein as enabling and disabling signals) are supplied respectively to the inputs of transmission gates 27 and 28. Since it is desired that transmission gates 27 and 28 be conductive only during the time period when it is desired to write into the memory storage element, a write enable control signal, shown as waveform 4B and derived from timing source 9, is applied via lead 24 to the enabling inputs 29 and 30 of transmission gates 27 and 28, respectively.

The waveforms 4C and 4D illustrate, respectively, the outputs 26 and 25 of flip-flop 15 and waveforms 4E and 4F show the signals on the output terminals 91 and 90 of transmission gates 28 and 27. Consider the signal on the output terminal 91 of transmission gate 28. At time $t_0$ in waveform 4B the transmission gates 28 and 29 (FIG. 1) are enabled by the write enable control signal 110 supplied from timing source 9. However, at time $t_0$ transmission gate 28 has a high level enabling signal supplied thereto from the set output 26 of flip-flop 15. Because of the presence of capacitor 46 a finite time is required for the potential of the output of transmission gate 28 to increase to a high level value. Such finite charging time is defined as time $\delta_1$ in waveform 4E and will occur each time a change in potential occurs at the output of either transmission gate 28 or transmission gate 27. Such charging time accounts for the sloped leading and trailing edges of the pulses 120 through 124 of waveforms 4E and 4F. Also at time $t_1$ the pulse 110 of waveform 4B terminates. At time $t_1$ the output impedance of transmission gate 28 will, for all practical purposes, become infinite so that capacitor 46 will remain substantially at positive five volts from time $t_1$ until time $t_2$, as shown in waveform 4E. At time $t_2$ the read sampling pulse 125 of waveform 4G is supplied to input 39 of detection and utilization means 40 of FIG. 1 which responds thereto to sample the voltage potential across capacitor 46. Such sampling will discharge capacitor 46 by a small voltage $\Delta V$, as shown in waveform 4E. Such sampling of the voltage across capacitor 46 is, in fact, a reading of the contents of the memory device 80. Simultaneously, with the sampling of the voltage across capacitor 46 the read pulse 125 of waveform 4G is also supplied through OR gate 35 to enable transmission gate 37 and thereby supply ground potential to gate electrode $G_{P4}$ of device P4 which thereof becomes conductive.

During the time period $t_0$ to $t_1$ when memory device 80 contains a binary 1 and the capacitor 46 is being charged to a positive 5 volts, the lower electrode of capacitor 45 will have been discharged to ground potential through transmission gate 27 as shown in waveform 4F.

At time $t_4$ a binary 0 is written into the memory storage means 80 by supplying a low level signal to the input terminal 10 of FIG. 1. Such low level signal is inverted by inverter 11 to cause flip-flop 15 to be reset so that the reset terminal 25 thereof has a high level signal thereon and the set output terminal 26 has a low signal level signal thereon. Subsequentally, by means of write pulse 113 of waveform 4B transmission gates 27 and 28 are both enabled during the time period $t_4$ to $t_5$. Transmission gate 37 is also enabled by write pulse 113 theough OR gate 35 to make both devices P3 and P4 conductive. During this time period $t_4$ to $t_5$ a high level enabling signal will be supplied through enable transmission gate 27 to charge capacitor 45 and also to supply the 5 volt level from source 50 to the input terminal junction 63 through conductive device P3. Simultaneously, a low level signal is supplied through enabled transmission gate 28 to supply a low level disabling signal through the conductive device P4 to input junction 60. The devices P3 and P4 become conductive during the time period $t_4$–$t_5$ due to the signal 113 of waveform 4B being applied to OR gate 35 from lead 24 to enable transmission gate 37, thereby supplying ground potential to the gate electrodes $G_{P3}$ and $G_{P4}$ of devices P3 and P4.

At time $t_7$ a read pulse 126 of waveform 4G is supplied to enabling means 40 (FIG. 1) to detect the charge on capacitor 46. As discussed above such charge is 0 volts since a binary 0 has been supplied through enabled transmission gate 28 during the time period $t_4$–$t_5$. The readout pulse 126 will not of itself change the charge on capacitor 45 since the input 47 to detection means 40 is not connected to the capacitor 45. However, capacitor 45 will become discharged at time $t_9$ when the high level write enable pulse 111 of waveform 4B is written into the system. Pulse 111 will enable transmission gate 27 to permit capacitor 45 to discharge through transmission gate 27 to the low level signal appearing on output lead 25 of flip-flop 15.

In a similar manner the mark and space pulses of waveform 4A, which occur at times $t_8$ and $t_{12}$, respectively, result in set and reset output signals 116 and 119 of flip-flop 15, as shown in waveforms 4C and 4D, which in conjunction with write enable pulses 111 and 114 of waveform 4B, in turn result in output signals 121 and 124 being supplied from transmission gates 28 and 27, as shown in waveforms 4E and 4F. The sampling pulses 127 and 128 of waveform 4C sample the charge on capacitor 46 in the same manner as discussed above re sampling pulses 125 and 126.

Although, as discussed above, the use of P-type access devices (P3 and P4 in FIG. 1) increases the performance of the memory cell by eliminating the radiation-induced leakage currents which would be present if N devices were used, the ability of the P device to function as a switch is also somewhat degraded with radiation exposure. This degradation is shown by points 97, 98 and 99 of curves 90, 91 and 92, respectively, in FIG. 3 as a reduction of current drive capability with radiation-induced threshold voltage shift. By clamping the bodies of the access devices P3 and P4 to the power supply potential, this degradation is minimized. The explanation is as follows.

The amount of threshold voltage shift for a given label of radiation is dependent upon the gate-to-body bias voltage, that is, potential difference between the gate and the body of the device during radiation exposure. The amount of threshold voltage shift for a given level of radiation exposure increases for larger gate-to-body bias voltages. When P-devices P3 and P4 are turned off (the voltages of $G_{P3}$ and $G_{P4}$ being at 5 volts) their bodies are free to float to a potential that is higher than the drain or source electrode (whichever is at the higher potential). Capacitive coupling can cause the bodies of P3 and P4 to be charged to a potential that is substantially higher than the power supply voltage. The gate-to-body bias voltage is thus the body voltage minus the power supply voltage since the gates of P3 and P4 are held at the power supply voltage to maintain P3 and P4 in the off state. By connecting the bodies of P3 and P4 to the power supply voltage as shown by lines 70 and 71 of FIG. 1, the gate-to-body bias voltage is reduced to zero when P3 and P4 are turned off. The above technique minimizes threshold voltage shift of P3 and P4 caused by low level radiation.

Another design technique that increases the hardness is a modified P-device to N-device size ratio. As shown in FIG. 2, the N-device drive current increases with radiation exposure as indicated by points 87, 88 and 89 of curves 80, 81 and 82, respectively. Also, FIG. 3 shows that the P-device drive current decreases with radiation exposure, as indicated by points 97, 98 and 99 of curves 90, 91 and 92, respectively. If the P-to-N sizes are adjusted so that logic gates have equalized output rise and fall times prior to radiation exposure, post-radiation rise times will be significantly longer than post-radiation fall times. Since gate delay is related to rise and fall times, delays for positive-going signals will be greater than delays for negative-going signals. This large difference in delay times could create problems where critical delay paths are concerned. By adjusting the P-to-N device size ratio to a larger value than is normally done, the maximum deviation of rise and fall times (and thus the positive-going and negative-going delay times) from their optimal values can be reduced over the range of radiation exposure.

What is claimed is:

1. In combination with a bistable device comprised of N and P-type devices, and having first and second input terminals, and responsive to high and low level signals or to low and high level signals supplied to said first and second input terminals, respectively, to assume its first or second state, respectively, accessing means for supplying high and low signal levels or low and high signal levels to said first and second input terminals, respectively, and comprising:

first and second P-type devices each having a drain electrode connected to one of said input terminals, a source electrode, and a gate electrode, and responsive to enabling and disabling voltages applied across said gate electrode and said source electrode to supply said high level signal or said low level signal, respectively, to said one of said input terminals;

means for generating a control signal having first and second levels;

logic means responsive to the first level of said control signal to generate and supply said enabling and disabling signals to said first and second P-type devices respectively, and responsive to said second level of said control signal to generate and supply said enabling and disabling signals to said second and first P-type devices, respectively;

means for supplying a reference potential to the gate electrodes of said first and second P-type devices when said enabling and disabling voltages are supplied to said first and second P-type devices; and means for sensing the state of said bistable device comprising:

capacitor means connected between said source electrodes of said first and second P-type devices and said reference potential; and means for detecting the potential across said capacitor means during a time period between successive level changes of said control signal.

2. In combination with a bistable device comprised of N and P-type devices, having at least one input terminal, and responsive to high and low level signals supplied to said at least one input terminal to assume its first or second state, respectively, accessing means for supplying said high and low signal levels to said at least one input terminal and comprising:

a second P-type device having a drain electrode connected to said at least one input terminal, a source electrode, a gate electrode, and responsive to enabling and disabling voltages applied across said gate electrode and said source electrode to supply said high level signal or said low level signal, respectively, to said at least one input terminal;

means for generating a control signal having first and second levels;

logic means responsive to the first level of said control signal to generate and supply said enabling signal to said second P-type device and responsive to the second level of said control signal to generate and supply said disabling signal to said second P-type device;

means for supplying a reference potential to the gate electrode of said second P-type device when said enabling or disabling voltages are supplied to said second P-type device; and means for sensing the state of said bistable device comprising;

capacitor means connected between said source electrode of said second P-type device and said reference potential; and means for detecting the potential across said capacitor means during a time period between successive level changes of said control signal.

3. In combination with a bistable device comprising N and P-type devices, having at least one input terminal, and responsive to high and low level signals supplied to said at least one input terminal to assume its first or second state, respectively, accessing means for selectively supplying said high and low levels to said at least one input terminal and comprising:

a second P-type device having a drain electrode connected to said at least one input terminal, a source electrode, and a gate electrode and responsive to enabling and disabling voltages applied across said gate electrode and said source electrode to supply said high level signal or said low level signal, respectively, to said at least one input terminal;

means for generating and supplying said enabling and disabling signals to said second P-type device during predetermined time intervals;

means for supplying a reference potential to said gate electrode during said predetermined time interval;

means for storing the potential difference between said reference potential and said enabling or disabling signals; and means for detecting said potential difference at predetermined times.

4. A radiation resistant solid-state memory device comprising:

a storage means having first and second states representing storage of a binary 1 or a binary 0, respectively;

first and second input terminals;

said storage means responsive to high and low level signals supplied to said first and second input terminals, respectively, to assume its first or second state, respectively;

accessing means for supplying high and low signal levels to said first and second input terminals, respectively, and to said second and first input terminals, respectively, comprising first and second P-type devices each having a drain electrode connected to one of said input terminals, a source electrode, and a gate electrode and responsive to enabling and disabling voltages applied across said gate electrode and said source electrode to supply said high level signal or said low level signal to said one of said input terminals;

means for generating a control signal having first and second levels; and logic means responsive to said first level of said control signal to supply said enabling and disabling signals to said first and second P-type devices, respectively, and responsive to said second level of said control signal to supply said enabling and disabling signals to said second and first P-type devices, respectively; and means for sensing the state of said bistable memory device during a time period between successive level changes of said control signals comprising;

means for supplying a reference potential to the gate electrodes of said P-type devices when said enabling and disabling voltages are supplied to said P-type devices;

capacitor means connected between said source electrodes of said P-type devices and said reference potential; and means for detecting the potential across said capacitor means during the time period between successive changes of said control signal.

* * * * *

UNITED STATES PATENT AND TRADEMARK OFFICE
CERTIFICATE OF CORRECTION

PATENT NO. : 4,418,402

DATED : November 29, 1983

INVENTOR(S) : William F. Heagerty, et al.

It is certified that error appears in the above-identified patent and that said Letters Patent is hereby corrected as shown below:

Col. 5, line 14, "level volt value" should be
--level 5 volt value--.

Col. 7, line 67, "label" should be --level--.

Signed and Sealed this

Seventh Day of February 1984

[SEAL]

Attest:

GERALD J. MOSSINGHOFF

*Attesting Officer*     *Commissioner of Patents and Trademarks*